US009454930B2

(12) United States Patent
Oh et al.

(10) Patent No.: US 9,454,930 B2
(45) Date of Patent: Sep. 27, 2016

(54) DISPLAY PANEL

(71) Applicants: Eun Jung Oh, Asan-si (KR); Ju Bong An, Asan-si (KR)

(72) Inventors: Eun Jung Oh, Asan-si (KR); Ju Bong An, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 340 days.

(21) Appl. No.: 13/958,272

(22) Filed: Aug. 2, 2013

(65) Prior Publication Data

US 2014/0320543 A1 Oct. 30, 2014

(30) Foreign Application Priority Data

Apr. 29, 2013 (KR) .................... 10-2013-0047542

(51) Int. Cl.
*G09G 3/30* (2006.01)
*G09G 3/32* (2016.01)
*H01L 27/32* (2006.01)

(52) U.S. Cl.
CPC ........... *G09G 3/3233* (2013.01); *H01L 27/326* (2013.01); *G09G 2300/0426* (2013.01); *G09G 2300/0452* (2013.01); *G09G 2320/02* (2013.01); *G09G 2380/02* (2013.01)

(58) Field of Classification Search
CPC ......... G02F 1/133305; G09G 3/3233; G09G 2300/0426; G09G 2300/0452; G09G 2320/02; G09G 2380/02; H01L 27/3244; H01L 27/326; H01L 51/0097
See application file for complete search history.

(56) References Cited

U.S. PATENT DOCUMENTS

| | | | |
|---|---|---|---|
| 2002/0027636 A1* | 3/2002 | Yamada | G02F 1/133305 349/155 |
| 2004/0174375 A1* | 9/2004 | Credelle et al. | 345/589 |
| 2004/0196302 A1* | 10/2004 | Im et al. | 345/690 |
| 2006/0012733 A1* | 1/2006 | Jin et al. | 349/73 |
| 2006/0077544 A1* | 4/2006 | Stark | G02F 1/13336 359/448 |
| 2007/0262916 A1* | 11/2007 | Kee et al. | 345/1.3 |
| 2009/0296249 A1* | 12/2009 | van Lieshout et al. | 359/892 |
| 2010/0117528 A1* | 5/2010 | Fukuda | 313/505 |
| 2010/0117928 A1* | 5/2010 | Shim et al. | 345/1.3 |
| 2010/0214195 A1* | 8/2010 | Ogasawara et al. | 345/55 |
| 2011/0025594 A1* | 2/2011 | Watanabe | G02F 1/13336 345/102 |
| 2011/0134145 A1* | 6/2011 | Moriwaki | G09G 3/3208 345/660 |
| 2011/0249021 A1* | 10/2011 | Yoshida | G09G 3/20 345/606 |
| 2012/0236483 A1* | 9/2012 | Watanabe | G02F 1/13336 361/679.01 |
| 2012/0249622 A1* | 10/2012 | Yoshida | G09G 3/3611 345/698 |
| 2013/0034685 A1* | 2/2013 | An et al. | 428/121 |
| 2013/0083080 A1* | 4/2013 | Rappoport | G09G 3/20 345/690 |
| 2013/0100053 A1* | 4/2013 | Kang et al. | 345/173 |
| 2013/0222432 A1* | 8/2013 | Arrasvuori | G06F 3/0487 345/660 |

(Continued)

FOREIGN PATENT DOCUMENTS

JP 2007-333818 A 12/2007
KR 10-2011-0108049 A 10/2011

*Primary Examiner* — Amare Mengistu
*Assistant Examiner* — Crystal A Mathews
(74) *Attorney, Agent, or Firm* — Lewis Roca Rothgerber Christie LLP

(57) ABSTRACT

A display panel includes a flat area and a bent area bent relative to the flat area. The flat area includes a plurality of first pixels, and the bent area includes a plurality of second pixels. Each of the second pixels has an area greater than an area of each of the first pixels.

20 Claims, 10 Drawing Sheets

(56) References Cited

U.S. PATENT DOCUMENTS

| | | | |
|---|---|---|---|
| 2014/0002331 A1* | 1/2014 | Yoo | G09G 3/3208 345/76 |
| 2014/0097440 A1* | 4/2014 | Jeon | 257/72 |
| 2014/0231763 A1* | 8/2014 | Kim | 257/40 |
| 2014/0346474 A1* | 11/2014 | Jeong | H01L 27/32 257/40 |
| 2014/0361262 A1* | 12/2014 | Kim | H01L 27/3218 257/40 |
| 2015/0029652 A1* | 1/2015 | Min et al. | 361/679.27 |
| 2015/0029683 A1* | 1/2015 | Kim et al. | 361/749 |
| 2015/0108439 A1* | 4/2015 | Kim et al. | 257/40 |
| 2015/0162392 A1* | 6/2015 | Lim | H01L 27/3244 257/72 |
| 2015/0177561 A1* | 6/2015 | Yoshida | G09G 3/36 345/32 |

\* cited by examiner

DISPLAY PANEL

CROSS-REFERENCE TO RELATED APPLICATION

This patent application claims priority to and the benefit of Korean Patent Application No. 10-2013-0047542, filed on Apr. 29, 2013, the contents of which are hereby incorporated by reference in its entirety.

BACKGROUND

1. Field

The exemplary embodiments of the present invention relate to a display panel. More particularly, the exemplary embodiments of the present invention relate to a display panel that is capable of being bent.

2. Description of the Related Art

A flat-surface type display device has been developed in order to replace a cathode ray tube display device having relatively thick thickness and high power consumption. Flat-surface type display devices that have been developed include various display devices, such as organic light emitting display devices, liquid crystal display devices, plasma display panels, etc.

In recent years, demand for display devices which provide a sense of immersion and presence have increased, and thus a curved display device has been developed. In addition, bent image display devices having a three-dimensional display surface have been developed. The bent image display devices include a flat area and a bent area.

SUMMARY

Embodiments of the present invention provide a bent display panel having improved display quality.

One embodiment of the inventive concept provides a display panel including a flat area and a bent area bent relative to the flat area. The flat area includes a plurality of first pixels and the bent area includes a plurality of second pixels each having an area greater than an area of each of the first pixels. The flat area may include a flat display surface and the bent area may include a curved display surface.

Each of the first pixels and each of the second pixels may include a first sub-pixel, a second sub-pixel, and a third sub-pixel which display different colors from each other. For each of the first and second pixels, the first sub-pixel may display a red color, the second sub-pixel may display a green color, and the third sub-pixel may display a blue color.

At least one of the first sub-pixel, the second sub-pixel, or the third sub-pixel of each of the second pixels may have an area that is smaller than that of the other ones of the first, second, and third sub-pixels. The other ones of the first, second, and third sub-pixels may have the same area.

The first sub-pixel, the second sub-pixel, and the third sub-pixel of each of the first pixels may have a same area.

Each of the first pixels and/or each of the second pixels may further include a fourth sub-pixel that displays a white color.

For each of the first and second pixels, each of the first sub-pixel, the second sub-pixel, and the third sub-pixel may include an organic light emitting device that receives a first source voltage and a second source voltage lower than the first source voltage to emit a light.

Another embodiment of the inventive concept provides a display panel including a flat area and a bent area bent relative to the flat area. The flat area includes a plurality of first pixels each having a first sub-pixel, a second sub-pixel, and a third sub-pixel. The bent area includes a plurality of second pixels each having a fourth sub-pixel, a fifth sub-pixel, and a sixth sub-pixel. The fourth sub-pixel has an area different from an area of each of the fifth and sixth sub-pixels. For each of the second pixels, the fourth, fifth, and sixth sub-pixels may display different colors from each other.

According to the above, when viewed from a front surface of the display panel, the first pixels in the flat area have the same apparent or perceived area as the second pixels in the bent area. In other words, the area of the second pixels, which is projected to the front surface, appears to be or is perceived to be substantially the same as the first pixels.

Although partial images of one image may be respectively displayed in the flat area and the bent area, the viewer may perceive the one image without being distorted from the front surface of the display panel. In addition, the viewer may perceive the images independently displayed in the flat area and the bent area.

In one embodiment, each of the second pixels includes a blue sub-pixel having an area smaller than a red sub-pixel and a green sub-pixel. Accordingly, a bluish image may be prevented from being displayed in the bent area. In another embodiment, each of the second pixels includes a red sub-pixel having an area smaller than a blue sub-pixel and a green sub-pixel. Thus, a reddish image may be prevented from being displayed in the bent area.

BRIEF DESCRIPTION OF THE DRAWINGS

The above and other advantages of the present invention will become readily apparent by reference to the following detailed description when considered in conjunction with the accompanying drawings, wherein.

DETAILED DESCRIPTION

Figure 1:
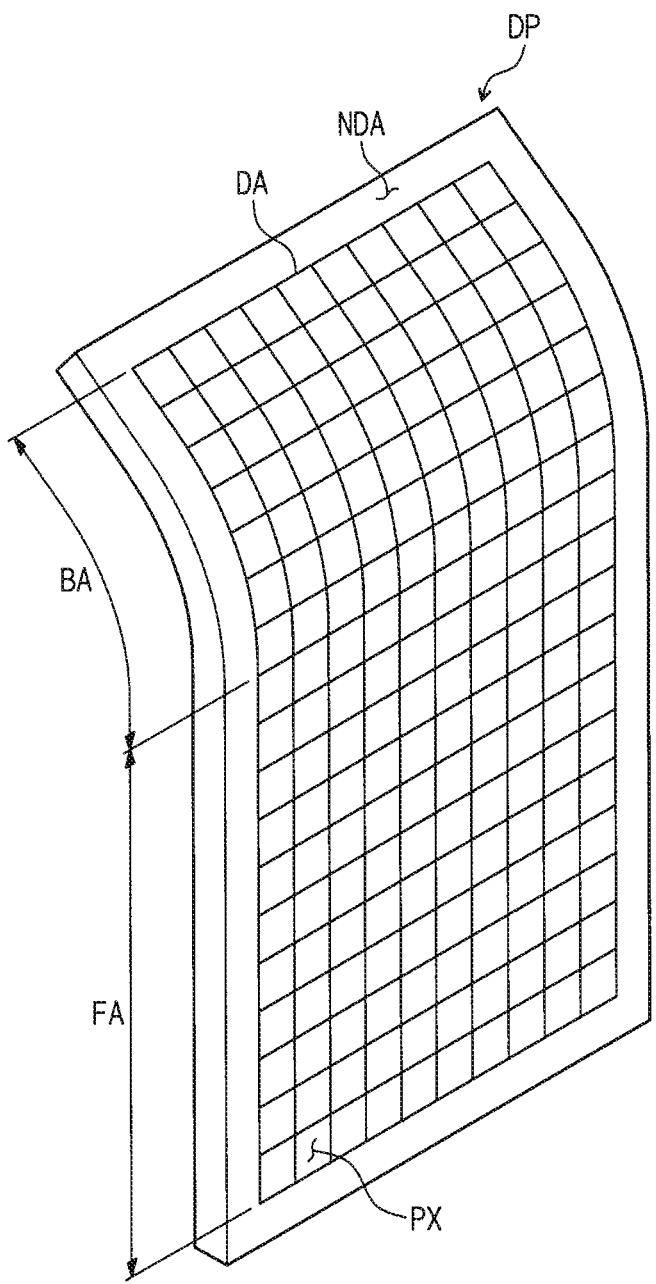
FIG. 1 is a perspective view showing a display panel according to an exemplary embodiment of the present invention.

It will be understood that when an element or layer is referred to as being "on", "connected to," or "coupled to" another element or layer, it can be directly on, connected, or coupled to the other element or layer or intervening elements or layers may be present. In contrast, when an element is referred to as being "directly on," "directly connected to," or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the present invention.

Spatially relative terms, such as "beneath", "below", "lower", "above", "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an," and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

FIG. 1 is a perspective view showing a display panel according to an exemplary embodiment of the present invention and FIGS. 2A to 2D are plan views showing pixels that can be included in the display panel of FIG. 1.

Referring to FIG. 1, the display panel DP has a shape that is partially bent. The display panel DP includes a flat area FA and a bent area BA. The flat area FA serves as a flat display surface and the bent area BA serves as a curved display surface. According to another exemplary embodiment of the present invention, the display panel may include a bent area, which is bent at a predetermined degree with respect to the flat area and provided with the flat display surface.

When the bent area BA is spread out, the display panel DP has a rectangular shape. Hereinafter, a short side direction of the display panel DP is referred to as a first direction DR1 and a long side direction of the display panel DP is referred to as a second direction DR2. In addition, a thickness direction of the display panel DP is referred to as a third direction DR3.

The bent area BA is bent from a side portion of the flat area FA along the second direction DR2. The display panel DP includes one bent area BA, but it should not be limited thereto or thereby. That is, the display panel may include a plurality of bent areas.

The display panel DP includes a plurality of pixels PX to display an image. A portion of the pixels PX is located in the flat area FA and a remaining portion of the pixels PX is located in the bent area BA. The flat area FA and the bent area BA may respectively display images forming one image. In addition, the flat area FA and the bent area BA may independently display different images, respectively.

The flat area FA and the bent area BA that display the image are collectively referred to as a display area DA, and an area disposed adjacent to or around the display area DA is referred to as a non-display area NDA in which the image is not displayed. The non-display area NDA surrounds the display area DA. Signal lines (not shown) and pad portions (not shown) are generally disposed in the non-display area NDA of the display panel DP. The display panel DP may be used as a part of a display device, such as a television set, a computer monitor, a mobile terminal, etc.

Referring to FIGS. 2A to 2D, each pixel includes a plurality of sub-pixels. The sub-pixels display different colors from each other.

Figure 2A:
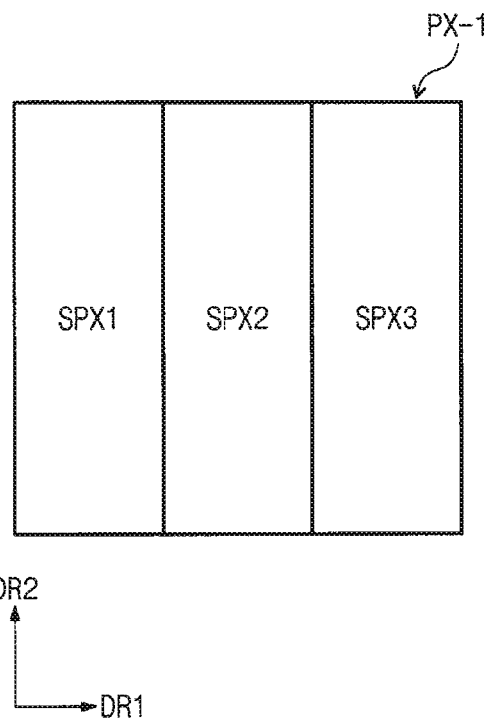
FIGS. 2A to 2D are plan views showing a pixel shown in FIG. 1.

As shown in FIG. 2A, a pixel PX-1 includes a first sub-pixel SPX1, a second sub-pixel SPX2, and a third sub-pixel SPX3, which are arranged in the first direction DR1. The first, second, and third sub-pixels, SPX1, SPX2, and SPX3 respectively display red, green, and blue colors. According to another exemplary embodiment, the first, second, and third sub-pixels, SPX1, SPX2, and SPX3 may respectively display magenta, cyan, and yellow colors.

Figure 2B:
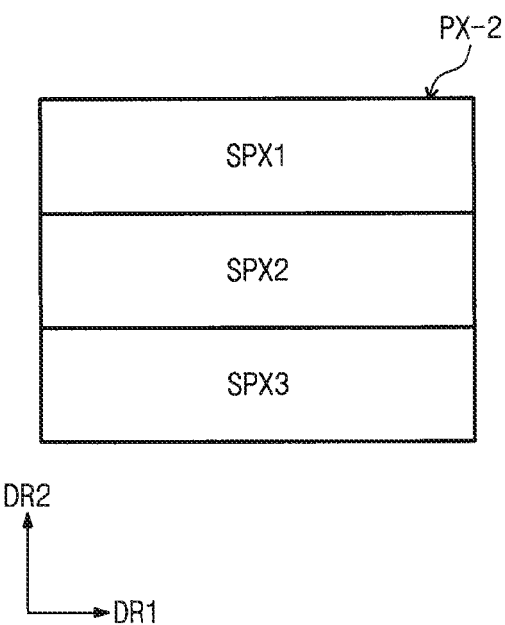

Referring to FIG. 2B, a pixel PX-2 includes first, second, and third sub-pixels SPX1, SPX2, and SPX3 arranged in the second direction DR2.

Figure 2C:
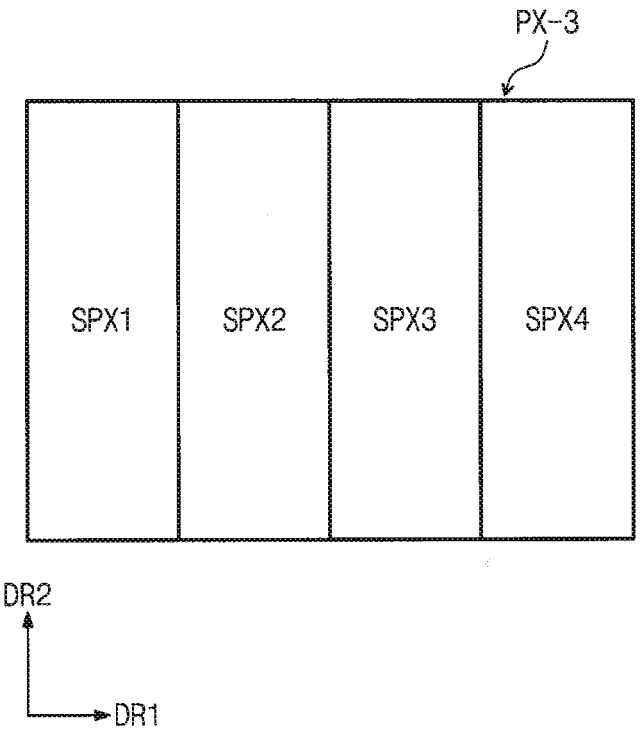

Referring to FIG. 2C, a pixel PX-3 may further include a fourth sub-pixel SPX4. The fourth sub-pixel SPX4 is disposed adjacent to the third sub-pixel SPX3 and displays a white color. Accordingly, brightness of the pixel PX-3 can be improved.

Figure 2D:
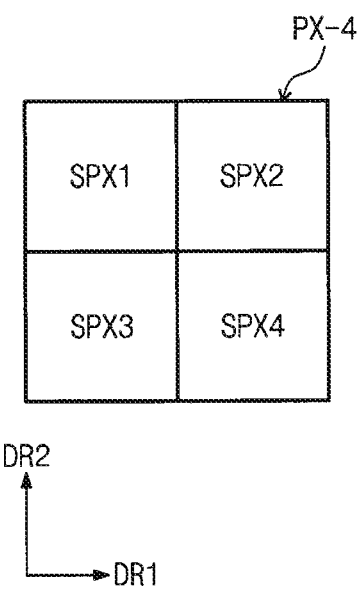

Referring to FIG. 2D, a pixel PX-4 includes first, second, third, and fourth sub-pixels, SPX1, SPX2, SPX3, and SPX4 arranged in a pentile matrix. The first and second sub-pixels SPX1 and SPX2 are arranged in the first direction DR1, and the third and fourth sub-pixels SPX3 and SPX4 are arranged in the first direction DR1. The first and third sub-pixels SPX1 and SPX3 are arranged in the second direction DR2, and the second and fourth sub-pixels SPX2 and SPX4 are arranged in the second direction DR4.

Figure 3:
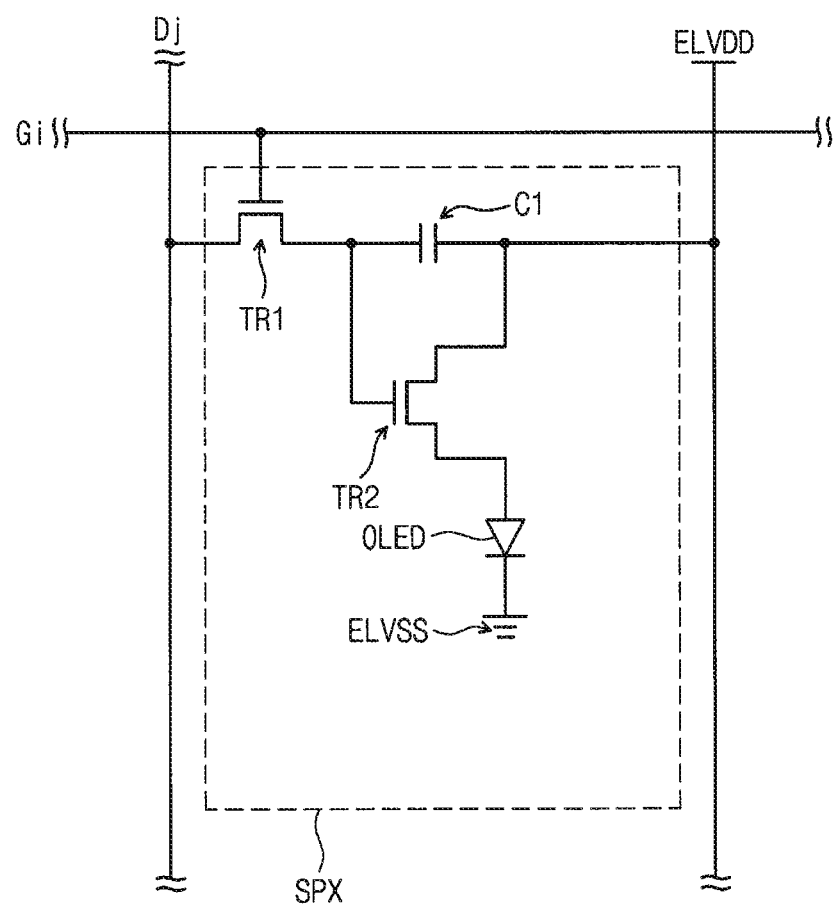
FIG. 3 is an equivalent circuit diagram showing a sub-pixel shown in FIGS. 2A to 2D.

FIG. 3 is an equivalent circuit diagram showing a sub-pixel shown in FIGS. 2A to 2D. Hereinafter, an organic light emitting pixel will be described as the sub-pixel, but the sub-pixel should not be limited to such an organic light emitting pixel.

Referring to FIG. 3, the sub-pixel SPX is connected to an i-th gate line Gi and a j-th data line Dj. The sub-pixel SPX is operated in response to a gate signal applied to the i-th gate line Gi. The sub-pixel SPX includes a first transistor TR1, a second transistor TR2, a capacitor C1, and an organic light emitting device OLED. The configuration of the sub-pixel SPX may be varied in various ways except for the organic light emitting device OLED.

The sub-pixel SPX receives a first source voltage ELVDD and a second source voltage ELVSS and generates light in response to a data signal applied to the j-th data line Dj. The first and second source voltages ELVDD and ELVSS have different voltage levels from each other.

The first transistor TR1 includes a gate electrode connected to the i-th gate line Gi, a source electrode connected to the j-th data line Dj, and a drain electrode. The first transistor TR1 outputs the data signal applied to the j-th data line Dj in response to the gate signal applied to the i-th gate line Gi.

The capacitor C1 includes a first electrode connected to the first transistor TR1 and a second electrode applied with the first source voltage ELVDD. The capacitor C1 is charged with electric charges corresponding to the data signal from the first transistor TR1 and the first source voltage ELVDD.

The second transistor TR2 includes a gate electrode connected to the drain electrode of the first transistor TR1 and the first electrode of the capacitor C1, a source electrode applied with the first source voltage ELVDD, and a drain electrode connected to the organic light emitting device OLED.

The second transistor TR2 applies the first source voltage ELVDD to the organic light emitting device OLED in response to the electric charges charged in the capacitor C1. The capacitor C1 maintains the turn-on period of the second transistor TR2.

The organic light emitting device OLED includes a first electrode connected to the second transistor TR2 and a second electrode applied with the second source voltage ELVSS. The organic light emitting device OLED includes an organic light emitting layer disposed between the first electrode and the second electrode, and may further include functional layers.

Figure 4:
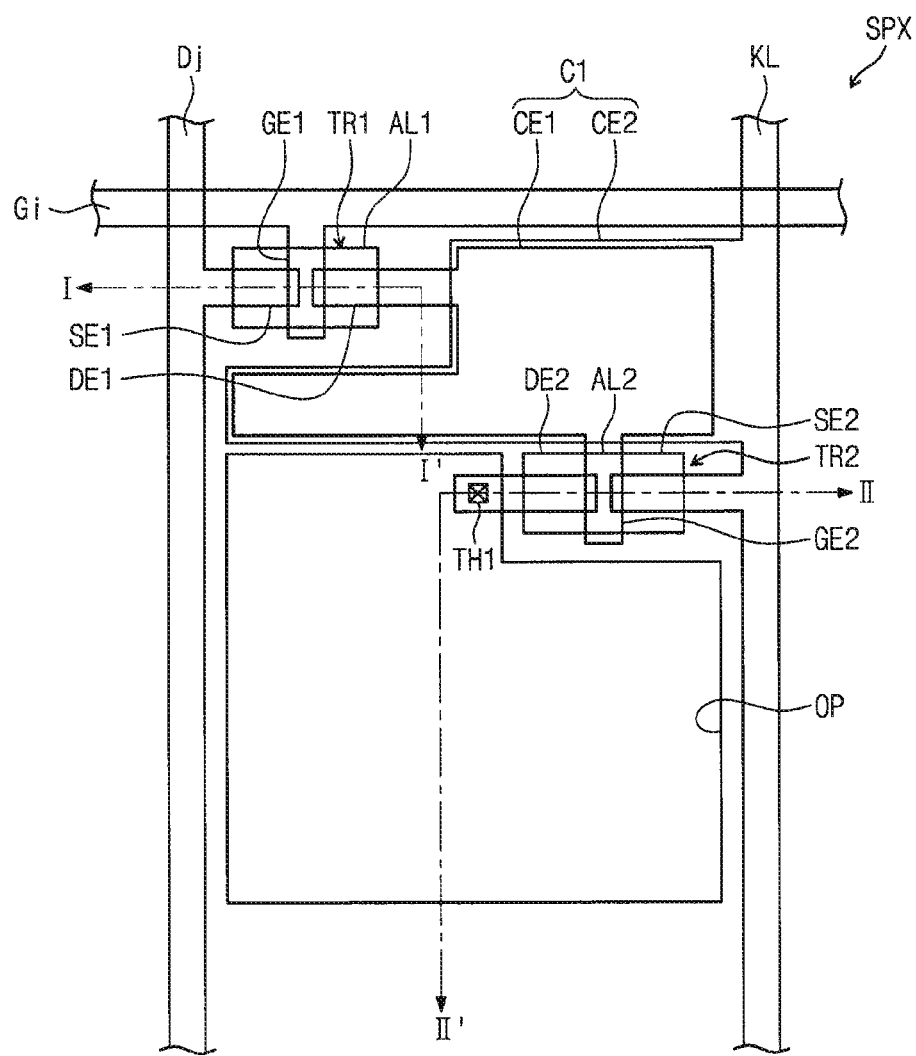
FIG. 4 is a layout showing the sub-pixel shown in FIG. 3.
Figure 5A:
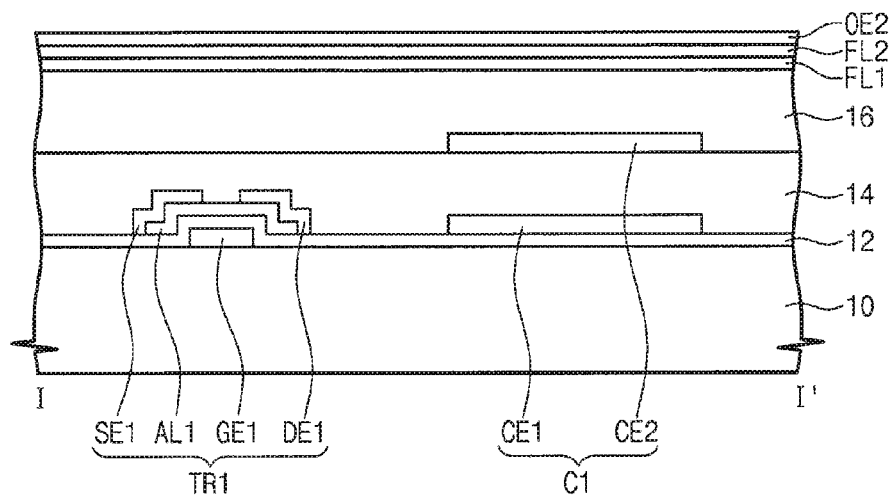
FIGS. 5A and 5B are cross-sectional views showing the sub-pixel shown in FIG. 4.
Figure 5B:
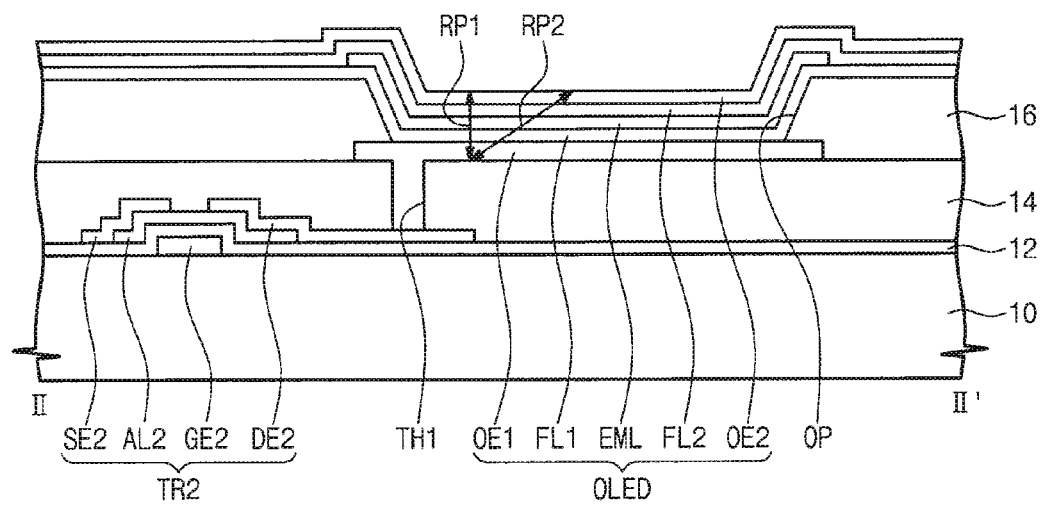

FIG. 4 is a layout showing the sub-pixel shown in FIG. 3 and FIGS. 5A and 5B are cross-sectional views showing the sub-pixel shown in FIG. 4. In FIG. 4, the organic light emitting device has not been shown.

Referring to FIGS. 4, 5A, and 5B, the i-th gate line Gi and the j-th data line Dj are on a base substrate 10 and insulated from each other. In addition, a source voltage line KL is on the base substrate 10 to receive the first source voltage ELVDD.

The gate electrode GE1 of the first transistor TR1 (hereinafter, referred to as first gate electrode) is branched from the i-th gate line Gi. A first insulating layer 12 is on the base substrate 10 to cover the i-th gate line Gi. The first insulating layer 12 includes an organic layer and/or an inorganic layer.

A semiconductor layer AL1 of the first transistor TR1 (hereinafter, referred to as first semiconductor layer) is on the first gate electrode GE1 while interposing the first insulating layer 12 therebetween. The first semiconductor layer AL1 may include amorphous silicon or metal oxide semiconductor.

The source electrode SE1 of the first transistor TR1 (hereinafter, referred to as first source electrode) and the drain electrode DE1 of the first transition TR1 (hereinafter, referred to as first drain electrode) overlap with the first semiconductor layer AL1. The first source electrode SE1 and the first drain electrode DE1 are spaced apart from each other.

The first electrode CE1 of the capacitor C1 is on the first insulating layer 12 and connected to the first drain electrode DE1.

A second insulating layer 14 is disposed on the first insulating layer 12 to cover the first source electrode SE1, the first drain electrode DE1, and the first electrode CE1 of the capacitor C1. The second electrode CE2 of the capacitor C1 is on the second insulating layer 14 and connected to the source voltage line KL.

The gate electrode GE2 of the second transistor TR2 (hereinafter, referred to as second gate electrode) is connected to the first electrode CE1 of the capacitor C1. A semiconductor layer AL2 of the second transistor TR2 (hereinafter, referred to as second semiconductor layer) is on the second gate electrode GE2 while interposing the first insulating layer 12 therebetween. The source electrode SE2 of the second transistor TR2 (hereinafter, referred to as second source electrode) and the drain electrode DE2 of the second transistor TR2 (hereinafter, referred to as second drain electrode) overlap with the second semiconductor layer AL2. The second source electrode SE2 and the second drain electrode DE2 are spaced apart from each other. The second insulating layer 14 covers the second source electrode SE2 and the second drain electrode DE2.

The organic light emitting device OLED is on the second insulating layer 14. In the organic light emitting device OLED, the first electrode OE1 is on the second insulating layer 14, a first common layer FL1 is on the first electrode OE1, an organic light emitting layer EML is on the first common layer EL1, a second common layer FL2 is on the organic light emitting layer EML, and the second electrode OE2 is on the second common layer FL2.

The first electrode OE1 is connected to the second drain electrode DE2 through a first contact hole TH1 formed through the second insulating layer 14. The first common layer EL1 includes a hole injection layer. In addition, the first common layer FL1 may further include a hole transporting layer on the hole injection layer. The second common layer FL2 includes an electron injection layer. In addition, the second common layer FL2 may further include an electron transporting layer between the organic light emitting layer EML and the electron injection layer.

A third insulating layer 16 is on the second insulating layer 14. The third insulating layer 16 covers the second electrode CE2 of the capacitor C1. The third insulating layer 16 includes an opening OP formed therethrough to expose the first electrode OE1 of the organic light emitting device OLED. A sidewall that defines the opening OP is inclined with respect to the first electrode OE1.

The first common layer FL1 is on the third insulating layer 16. The first common layer FL1 extends into the opening OP to make contact with the first electrode OE1. The first common layer FL1 is also on the sidewall of the opening OP.

The organic light emitting layer EML is on the first common layer FL1 corresponding to the opening OP. The second common layer FL2 is on the first common layer FL1. The second common layer FL2 covers the organic light emitting layer EML. The second electrode OE2 is on the second common layer FL2.

In some embodiments, the first electrode CE1 includes a metal material and the second electrode CE2 includes a transparent conductive material to perform a front surface light emitting operation. According to another exemplary embodiment, the first electrode CE1 includes the transparent conductive material and the second electrode CE2 includes the metal material to perform a rear surface light emitting operation.

The organic light emitting layer EML may include dopants. The sub-pixel SPX generates the red light, the green light, or the blue light according to the kind of dopants included.

In addition, according to another exemplary embodiment, the organic light emitting layer EML may generate white light. In this case, the display panel DP includes a color filter. According to the color of the color filter, the sub-pixel SPX may display the red, green, or blue color. When the organic light emitting device OLED is the front surface light emitting type, the display panel DP may further include an opposite substrate facing the base substrate 10 and including the color filter. When the organic light emitting device OLED is the rear surface light emitting type, the second insulating layer 14 may be an organic layer having a predetermined color.

The organic light emitting device OLED according to the present exemplary embodiment may have a micro-cavity structure. The light generated by the organic light emitting device OLED has a specific wavelength amplified by an interference principle. One of the first and second electrodes OE1 and OE2 of the organic light emitting device OLED is a semi-transmission electrode and the other one of the first and second electrodes OE1 and OE2 is a reflection electrode. The semi-transmission electrode has a thickness in a range of a few micrometer to tens of micrometers and includes silver (Ag), aluminum (Al), nickel (Ni), magnesium (Mg), or an alloy thereof.

Figure 6:
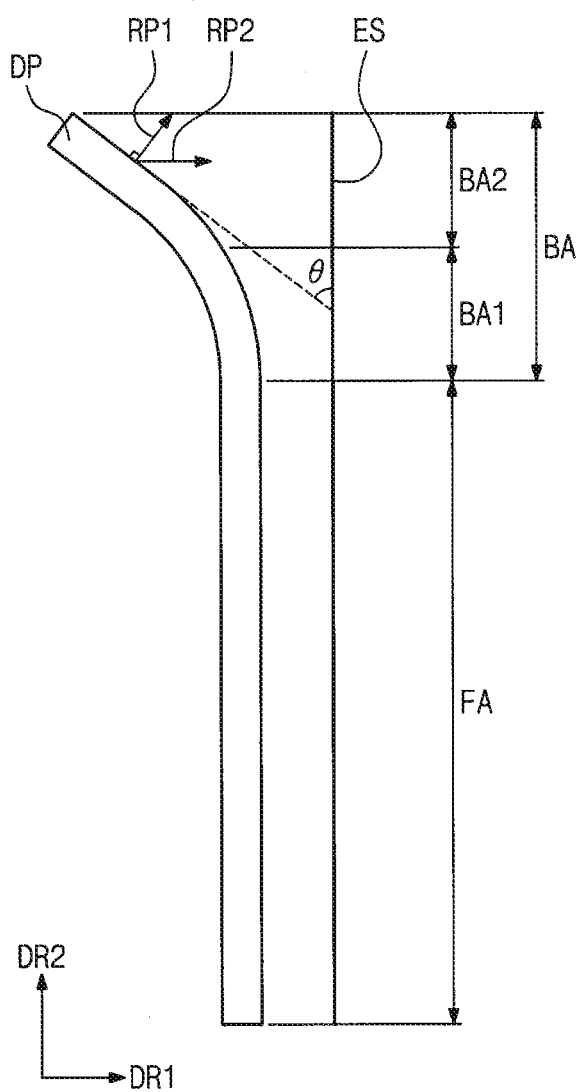
FIG. 6 is a side view showing a display panel according to an exemplary embodiment of the present invention.
Figure 7A:
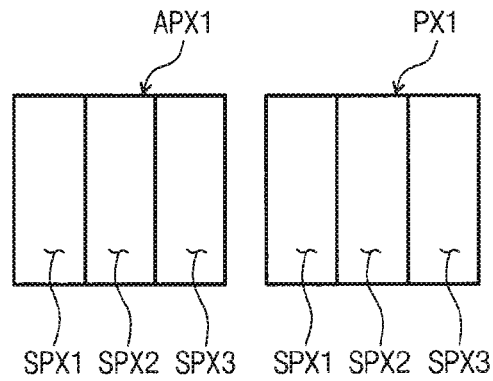
FIGS. 7A to 7C are views respectively showing first to third pixels according to an exemplary embodiment of the present invention.
Figure 7B:
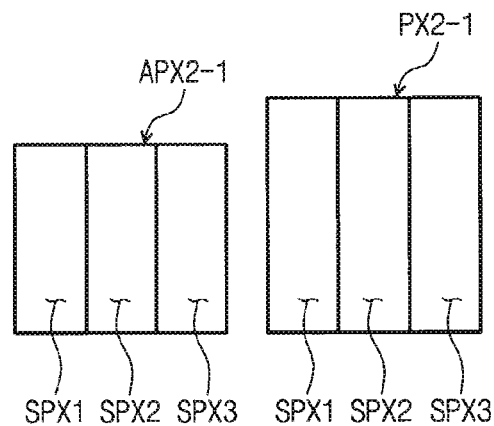
Figure 7C:
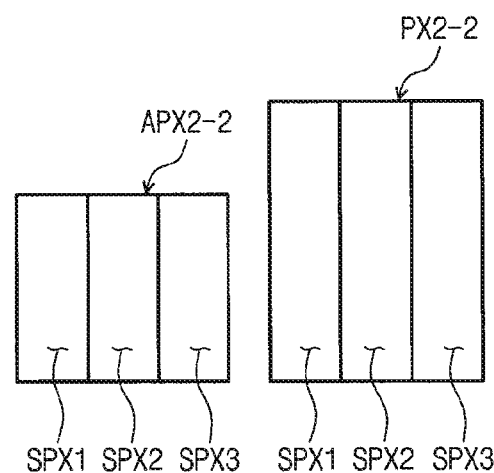

FIG. 6 is a side view showing a display panel according to an exemplary embodiment of the present invention and FIGS. 7A to 7C are views respectively showing first to third pixels according to an exemplary embodiment of the present invention.

In the present exemplary embodiment, the first pixel PX1 is located in the flat area FA and the second and third pixels PX2-1 and PX2-2 are located in the bent area BA. As shown in FIGS. 7A to 7C, the first pixel PX1, the second pixel PX2-1, and the third pixel PX2-2 include sub-pixels arranged in the same way as the pixel shown in FIG. 2A.

Referring to FIG. 6, the bent area BA includes partial areas BA1 and BA2 arranged in the second direction DR2. FIG. 6 shows two partial areas BA1 and BA2 (hereinafter, referred to as first and second partial areas). The second partial area BA2 is inclined at a predetermined included angle θ with respect to the flat area FA. The first partial area BA1 is inclined at an included angle with respect to the flat area FA, which is smaller than that of the second partial area BA2.

When the flat area FA and the bent area BA respectively display partial images of one image, the viewer perceives an effective image at a front surface of the display panel DP. The term of "front surface ES" used herein means an imaginary surface substantially parallel to the flat area FA. The effective image includes the partial image of the flat area FA and the partial image of the bent area BA projected to the front surface ES.

Referring to FIGS. 7A to 7C, the second pixel PX2-1 and the third pixel PX2-2 have an area greater than that of the first pixel PX1 in order to provide the viewer with the effective image through the front surface ES, which is not distorted. The first pixel PX1 is perceived as a first apparent pixel APX1 on the front surface ES of the display panel DP. The first apparent pixel APX1 and the first pixel PX1 have the same area on the front surface ES.

In contrast, the second pixel PX2-1 and the third pixel PX2-2 are respectively perceived as a second apparent pixel APX2-1 and a third apparent pixel APX2-2, each having an area smaller than the real area thereof, on the front surface ES of the display panel DP. This is because the viewer perceives the second and third pixels PX2-1 and PX2-2 projected onto the front surface ES.

The area of the second and third pixels PX2-1 and PX2-2 may be controlled to have the same apparent area as the first apparent pixel APX1. The area of the second and third pixels PX2-1 and PX2-2 is determined in consideration of the included angle between the bent area BA and the flat area FA, e.g., a cosine value of the included angle.

The third pixel PX2-2 has an area greater than that of the second pixel PX2-1, and thus the second and third pixels PX2-1 and PX2-2 have the same apparent area. Since the bent area BA becomes more bent as it goes along the second direction DR2, the third pixel PX2-2 is projected onto the front surface ES such that the third pixel PX2-2 is smaller than the second pixel PX2-1.

In the present exemplary embodiment, the display panel having the bent area BA provided with the flat surface may include the second and third pixels PX2-1 and PX2-2 having the same apparent or perceived area since the second and third pixels PX2-1 and PX2-2 are projected onto the front surface ES at the same rate.

Figure 8A:
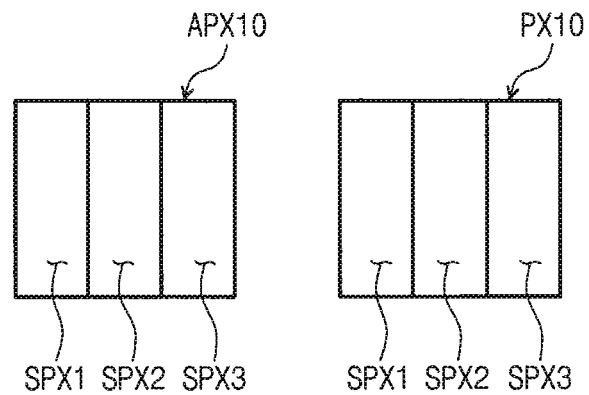
FIGS. 8A to 8C are views respectively showing first to third pixels according to another exemplary embodiment of the present invention.
Figure 8B:
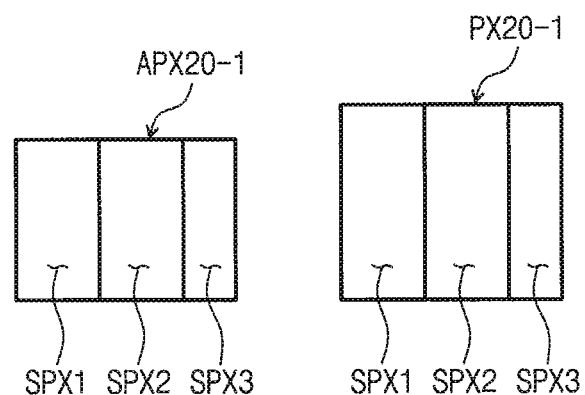
Figure 8C:
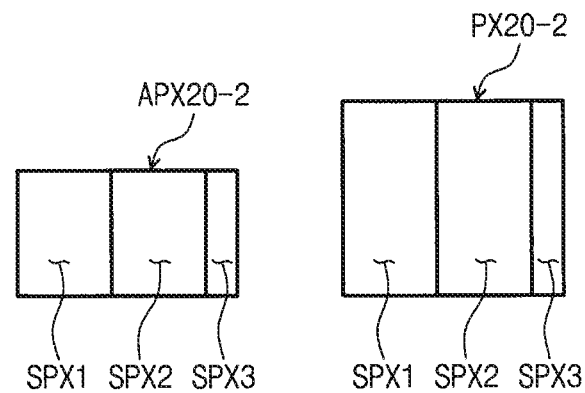

FIGS. 8A to 8C are views respectively showing first to third pixels according to another exemplary embodiment of the present invention. Hereinafter, a display panel according to the present exemplary embodiment will be described in detail with reference to FIGS. 6 and 8A to 8C. In FIGS. 6 and 8A to 8C, the same reference numerals denote the same or similar elements in FIGS. 6 and 7A to 7C, and thus detailed descriptions of the same elements will be omitted.

The flat area FA includes a first pixel PX10 and the bent area BA includes a second pixel PX20-1 and a third pixel PX20-2. The bent area BA includes a first partial area BA1 and a second partial area BA2, which are arranged along the second direction DR2.

The first pixel PX10, the second pixel PX20-1, and the third pixel PX20-2 have the same area. In this case, the first pixel PX10 is perceived to the viewer as a first apparent pixel APX10, and the second and third pixels PX20-1 and PX20-2 are perceived to the viewer as second and third apparent pixels APX20-1 and APX20-2.

Each of the first pixel PX10, the second pixel PX20-1, and the third pixel PX20-2 includes a first sub-pixel SPX1, a second sub-pixel SPX2, and a third sub-pixel SPX3. The first pixel PX10, the second pixel PX20-1, and the third pixel PX20-2 display different colors among red, green, and blue colors.

The first pixel PX10 includes the first, second, and third sub-pixels SPX1, SPX2, and SPX3 having the same area. At least one of the first sub-pixel SPX1, the second sub-pixel SPX2, or the third sub-pixel SPX3 of each of the second and third sub-pixels PX20-1 and PX20-2 has a different area from the others.

As shown in FIG. 6, the light generated from the second partial area BA2 travels in a first path RP1 and a second path RP2. The first path RP1 and the second path RP2 have been shown in FIG. 5B. The light traveling in the second path RP2 is projected to the front surface. The light traveling in the second path RP2 has an optical length different from that of the light traveling in the first path RP1.

The light traveling in the second path RP2 produces constructive interference in the corresponding path. The light traveling in the second path RP2 has a wavelength obtained by shifting a wavelength of the light traveling in the first path RP1. For instance, when the light traveling in the first path RP1 is perceived to the viewer as the white light, the light traveling in the second path RP2 is perceived to the viewer as a bluish white light or a reddish white light.

The light generated from the second pixel PX20-1 travels in the first path RP1 and the second path RP2. The first partial area BA1 forms an included angle with respect to the flat area FA, which is smaller than an included angle between the second partial area BA2 and the flat area FA, and the second pixel PX20-1 has a second path RP2 shorter than that of the third pixel PX20-2. The light emitted along the second path RP2 of the second pixel PX20-1 is shifted from the wavelength of the light emitted along the first path RP1, but the shift of the light emitted along the second path RP2 is smaller than that of the light emitted along the second path RP2 of the third pixel PX20-2.

To prevent the white light in the second and third pixels PX20-1 and PX20-2 from being discolored, the third pixel SPX3 of each of the second and third pixels PX20-1 and PX20-2 has an area smaller than the first and second sub-pixels SPX1 and SPX2 in each of the second and third pixels PX20-1 and PX20-2. In this case, the first sub-pixel SPX1 and the second sub-pixel SPX2 have the same area.

In the case that the second and third pixels PX20-1 and PX20-2 have a second path RP2 in which bluish white light is displayed, the red, green, and blue colors are balanced by reducing the area of the third sub-pixel SPX3 that displays the blue color. When the second and third pixels PX20-1 and PX20-2 have a second path RP2 in which reddish white light is displayed, the red, green, and blue colors are balanced by reducing the area of the third sub-pixel SPX3 that displays the red color.

The third sub-pixel SPX3 of the third pixel PX20-2 has an area smaller than that of the third sub-pixel SPX3 of the second pixel PX20-1. This is because the light traveling in the second path RP2 of the third pixel PX20-2 is more shifted than the light traveling in the second path RP2 of the second pixel PX20-1.

Figure 9A:
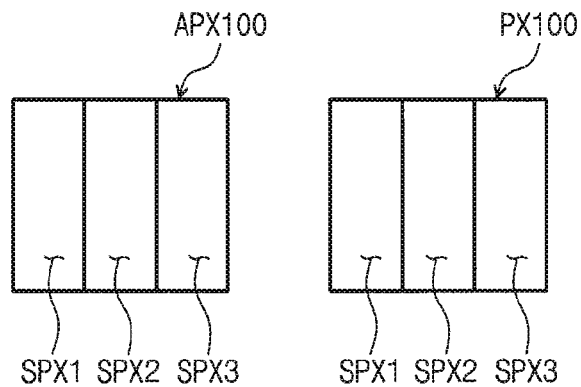
FIGS. 9A to 9C are views respectively showing first to third pixels according to yet another exemplary embodiment of the present invention.
Figure 9B:
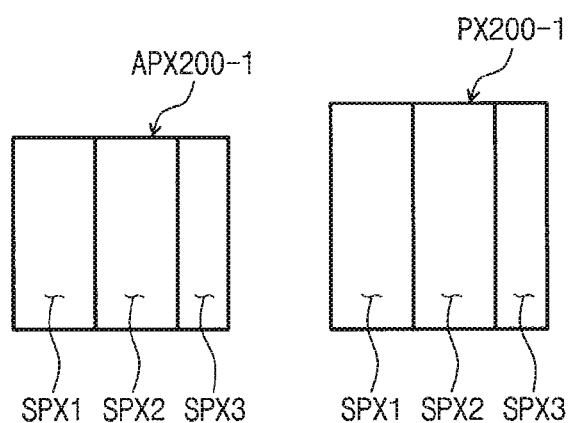
Figure 9C:
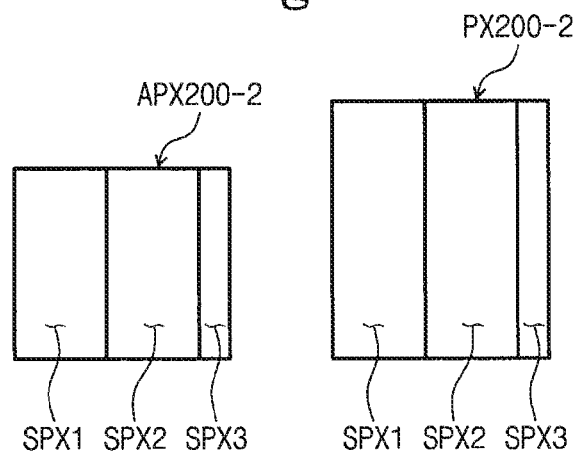

FIGS. 9A to 9C are views respectively showing first to third pixels according to yet another exemplary embodiment of the present invention. Hereinafter, a display panel according to the present exemplary embodiment will be described in detail with reference to FIGS. 9A to 9C. In FIGS. 9A to 9C, the same reference numerals denote the same or similar elements in FIGS. 6 and 8A to 8C, and thus detailed descriptions of the same elements will be omitted.

Referring to FIGS. 9A to 9C, the display panel includes a flat area FA and a bent area BA. The bent area BA includes a first partial area BA1 and a second partial area BA2, which are arranged along the second direction DR2. The flat area FA includes a first pixel PX100 and the bent area BA includes a second pixel PX200-1 and a third pixel PX200-2.

The first pixel PX100 is perceived to the viewer as a first apparent pixel APX100, and the second and third pixels PX200-1 and PX200-2 are perceived to the viewer as second and third apparent pixels APX200-1 and APX200-2. Each of the first pixel PX100, the second pixel PX200-1, and the third pixel PX200-2 includes a first sub-pixel SPX1, a second sub-pixel SPX2, and a third sub-pixel SPX3. The first pixel PX100, the second pixel PX200-1, and the third pixel PX200-2 display different colors among red, green, and blue colors.

To provide the effective image without being distorted to the viewer through the front surface ES, each of the second and third pixels PX200-1 and PX200-2 has an area greater than the first pixel PX100, so that the first, second, and third apparent pixels APX100, APX200-1, and APX200-2 have the same area.

The first pixel PX100 includes the first sub-pixel SPX1, the second sub-pixel SPX2, and the third sub-pixel SPX3, which have the same area. At least one of the first sub-pixel SPX1, the second sub-pixel SPX2, or the third sub-pixel SPX3 of each of the second and third pixels PX200-1 and PX200-2 has an area different from the others.

To prevent the white light in the second and third pixels PX200-1 and PX200-2 from being discolored, the third pixel SPX3 of each of the second and third pixels PX200-1 and PX200-2 has an area smaller than the first and second sub-pixels SPX1 and SPX2 in each of the second and third pixels PX200-1 and PX200-2. In this case, the first sub-pixel SPX1 and the second sub-pixel SPX2 have the same area.

In the case that the second and third pixels PX200-1 and PX200-2 have a second path RP2 in which bluish white light is displayed, the red, green, and blue colors are balanced by reducing the area of the third sub-pixel SPX3 that displays the blue color. When the second and third pixels PX200-1 and PX200-2 have a second path RP2 in which reddish white light is displayed, the red, green, and blue colors are balanced by reducing the area of the third sub-pixel SPX3 that displays the red color.

Although the exemplary embodiments of the present invention have been described, it is understood that the present invention should not be limited to these exemplary embodiments, but various changes and modifications can be made by one of ordinary skilled in the art within the spirit and scope of the present invention as hereinafter claimed.

What is claimed is:

1. A display panel comprising:
    a flat area comprising a plurality of first pixels; and
    a bent area bent relative to the flat area and comprising a plurality of second pixels each inclined at respective angles with respect to the plurality of first pixels in the flat area and having an area greater than an area of each of the first pixels.

2. The display panel of claim 1, wherein the flat area comprises a flat display surface and the bent area comprises a curved display surface.

3. The display panel of claim 1, wherein each of the first pixels and each of the second pixels comprises a first sub-pixel, a second sub-pixel, and a third sub-pixel which display different colors from each other.

4. The display panel of claim 3, wherein for each of the first and second pixels, the first sub-pixel displays a red color, the second sub-pixel displays a green color, and the third sub-pixel displays a blue color.

5. The display panel of claim 4, wherein the first pixels and the second pixels each further comprise a fourth sub-pixel that displays a white color.

6. The display panel of claim 3, wherein at least one of the first sub-pixel, the second sub-pixel, or the third sub-pixel of each of the second pixels has an area that is smaller than that of the other ones of the first, second, and third sub-pixels.

7. The display panel of claim 6, wherein the other ones of the first, second, and third sub-pixels have the same area.

8. The display panel of claim 6, wherein the first sub-pixel, the second sub-pixel, and the third sub-pixel of each of the first pixels have a same area.

9. The display panel of claim 3, wherein for each of the first and second pixels, each of the first sub-pixel, the second sub-pixel, and the third sub-pixel comprises an organic light emitting device that receives a first source voltage and a second source voltage lower than the first source voltage to emit a light.

10. A display panel comprising:
    a flat area comprising a plurality of first pixels each having a first sub-pixel, a second sub-pixel, and a third sub-pixel; and
    a bent area bent relative to the flat area and comprising a plurality of second pixels each inclined at respective angles with respect to the plurality of first pixels in the flat area and having a fourth sub-pixel, a fifth sub-pixel, and a sixth sub-pixel, wherein the fourth sub-pixel has an area different from an area of each of the fifth and sixth sub-pixels.

11. The display panel of claim 10, wherein for each of the second pixels, the fourth sub-pixel, the fifth sub-pixel, and the sixth sub-pixel display different colors from each other.

12. The display panel of claim 11, wherein each of the second pixels further comprises a seventh sub-pixel that displays a white color.

13. The display panel of claim 11, wherein for each of the second pixels, the fifth sub-pixel and the sixth sub-pixel each has an area greater than an area of the fourth sub-pixel.

14. The display panel of claim 13, wherein the fourth sub-pixel displays one of a red or a blue color, the fifth sub-pixel displays the other one of the red or the blue color, and the sixth sub-pixel displays a green color.

15. The display panel of claim 14, wherein the fifth sub-pixel and the sixth sub-pixel have a same area.

16. The display panel of claim 10, wherein for each of the first pixels, the first sub-pixel, the second sub-pixel, and the third sub-pixel have a same area and display different colors from each other.

17. The display panel of claim 16, wherein each of the first pixels comprises a seventh sub-pixel that displays a white color.

18. The display panel of claim 10, wherein for each of the first pixels, each of the first sub-pixel, the second sub-pixel, and the third sub-pixel comprises an organic light emitting device that receives a first source voltage and a second source voltage lower than the first source voltage to emit a light.

19. The display panel of claim 10, wherein for each of the second pixels, each of the fourth sub-pixel, the fifth sub-pixel, and the sixth sub-pixel comprises an organic light emitting device that receives a first source voltage and a second source voltage lower than the first source voltage to emit a light.

20. The display panel of claim 10, wherein the flat area provides a flat display surface and the bent area provides a curved display surface.

* * * * *